United States Patent [19]

Yu et al.

[11] Patent Number: 5,696,728
[45] Date of Patent: Dec. 9, 1997

[54] NEGATIVE VOLTAGE LEVEL SHIFT CIRCUIT

[75] Inventors: Andy Teng-Feng Yu, Palo Alto; Vikram Kowshik, San Jose, both of Calif.

[73] Assignee: Programmable Microelectronics Corp., San Jose, Calif.

[21] Appl. No.: 778,802

[22] Filed: Jan. 3, 1997

[51] Int. Cl.$^6$ ................................................ G11C 13/00
[52] U.S. Cl. ........................................ 365/218; 365/226
[58] Field of Search ............................ 365/218, 226, 365/189.05, 230.08

[56] References Cited

U.S. PATENT DOCUMENTS 5,193,073  3/1993  Bhuua ................................. 365/226

*Primary Examiner*—Terrell W. Fears
*Attorney, Agent, or Firm*—Skjerven, Morrill, MacPherson, Franklin & Friel

[57] ABSTRACT

A negative voltage level translator includes an output terminal which is electrically connected to a word line of the associated memory array. The voltage level of the output terminal, and thus the voltage level of the associated word line, is controlled by a cross-coupled latch. If the word line associated with the negative voltage level translator has been selected during erasing, the cross-coupled latch enters a first state which results in the output terminal being pulled to a negative erase voltage. This negative erase voltage, which may be generated by a negative charge pump, is in this manner coupled to the control gates of the array's selected memory cells to cause the erasing of such memory cells via, for instance, electron tunneling. If the word line associated with the output terminal has not been selected for erasing, the cross-coupled latch enters a second state which results in the output terminal being maintained at a floating potential. This floating potential is coupled to the control gates of un-selected memory cells and thereby precludes the erasing of such un-selected memory cells.

5 Claims, 2 Drawing Sheets

NEGATIVE VOLTAGE LEVEL SHIFT CIRCUIT

BACKGROUND

1. Field of the Invention

This invention relates generally to signal level translators and specifically to negative voltage level translators.

2. Description of Related Art

A negative voltage level translator may be used, for example, in a non-volatile memory array such as, for instance, a NMOS flash or NMOS EEPROM array, to convert a positive level signal into a negative voltage level during erasing mode. This negative voltage level is usually applied via a word line to the respective control gates of EEPROM or flash cells within the array selected for erasing, thereby resulting in the tunneling of electrons from the floating gates of the respective cells.

A negative voltage level translator 10 typical of that described above is shown schematically in FIG. 1. Translator 10 includes a CMOS inverter stage 12 coupled between a supply voltage $V_{cc}$ and ground potential, and also includes a latch stage 16 formed by NMOS transistors MN2 and MN3 and by PMOS transistor MP3. Inverter 12 is formed by NMOS transistor MN1 and PMOS transistors MP1 and MP2, where transistors MP1 and MN1 perform signal inversion and transistor MP2 provides negative voltage isolation between output terminal OUT and transistor MN1. The drain of PMOS transistor MP1 and the source of PMOS transistor MP2 are connected to output terminal OUT which, in turn, is connected to one or more word lines of an associated memory array. The source and bulk of NMOS transistor MN1 are electrically connected to ground potential, and the source of PMOS transistor MP1 and the respective bulks of PMOS transistors MP1 and MP2 are electrically connected to $V_{cc}$.

During erasing, a logic high signal is provided to inverter 12 via input terminal IN. This logic high signal causes transistor MN1 to turn on and transistor MP1 to turn off, thereby pulling output terminal OUT of translator 10 low towards ground potential. The resulting logic low signal at output terminal OUT turns on transistor MP3 and turns off transistor MN2, thereby pulling the gate of transistor MN3 high to the supply voltage $V_{cc}$. A conventional negative charge pump 14 is operated in a well known manner to generate a negative high voltage at the output terminal thereof. This negative high voltage is coupled to the P-wells and sources of NMOS transistors MN2 and MN3. As a result, the conducting transistor MN3 couples the negative high voltage generated by negative charge pump 14 to the associated memory array via output terminal OUT of translator 10. As discussed above, this negative high voltage facilitates erasing of floating gate memory cells within the associated array.

After erasing, negative charge pump 14 is deactivated so that the output terminal of negative charge pump 14 is allowed to float. Also, a logic low input signal is provided to inverter 12 via input terminal IN. In response thereto, transistor MN1 turns off and transistor MP1 turns on, thereby pulling output terminal OUT of translator 10 high to approximately $V_{cc}$. This high voltage on output terminal OUT causes transistor MP3 to turn off and transistor MN2 to turn on. Transistor MN3 is thus in a non-conductive state and thereby electrically isolates the output terminal of negative charge pump 14 from output terminal OUT of translator 10.

Translator 10 involves an undesirable trade-off between performance and fabrication complexity. Transistor MP2 needs to be a depletion mode device in order for output terminal OUT to achieve a full rail-to-rail voltage swing, i.e., from ground potential to the supply voltage $V_{cc}$. However, the fabrication of a depletion mode device requires an additional depletion layer masking step, thereby increasing the cost and complexity of the fabrication of translator 10. Further, since it is difficult to control with precision the threshold voltage of depletion mode devices, employing a depletion mode device as transistor MP2 may result in calibration errors.

In light of the above-described problems of employing a depletion mode device as isolation transistor MP2, an enhancement mode transistor is usually preferred as the isolation transistor MP2. Not only does the fabrication of an enhancement mode transistor not require an additional depletion layer masking step, but also the threshold voltage of an enhancement mode device is much easier to control than that of a depletion mode device.

However, if transistor MP2 is an enhancement mode device, transistor MP2 will not be able to pull output terminal OUT completely to ground potential. Rather, since the source of PMOS transistor MP2 must remain at least one $V_{tp}$ above the gate of transistor MP2 in order for transistor MP2 to conduct, where $V_{tp}$ is the threshold voltage of transistor MP2, PMOS transistor MP2 can only pull down output terminal OUT to approximately $V_{tp}$.

Since $V_{tp}$ for a typical PMOS enhancement mode transistor is approximately one volt, the voltage swing for small supply voltages $V_{cc}$ of output terminal OUT using a PMOS enhancement mode transistor may be significantly reduced from the voltage swing of terminal OUT when a PMOS depletion mode transistor is used. For instance, in those memory systems in which $V_{cc}$ is 3 volts or less, the inability to pull the input terminal of the latch stage 16, i.e., terminal OUT, to ground potential reduces the effective logic swing of the input terminal of latch 16 by one third or more. This reduction in the effective voltage swing of the input terminal of latch 16 requires that the two voltage levels $V_L$ and $V_H$ which define transitions from a logic high state to a logic low state and from a logic low state to a logic high state, respectively, of latch 16 be closer together. As the potential difference between levels $V_L$ and $V_H$ of latch 16 decreases, variations in the voltage level at output terminal OUT are increasingly more likely to cause latch 16 to erroneously transition between its two output states which, in turn, may result in translator 10 providing incorrect voltages to the associated memory array, thereby resulting in incomplete and/or inadvertent erasing operations of memory cells within the associated memory array.

SUMMARY

In accordance with the present invention, a negative voltage level translator facilitates the erasing of memory cells within an associated memory array. The negative voltage level translator includes an output terminal electrically connected to a word line of the associated memory array. The voltage level of the output terminal, and thus the voltage level of the associated word line, is controlled by a cross-coupled latch. If the word line associated with the negative voltage level translator has been selected during erasing of the memory array, the cross-coupled latch enters a first state which results in the output terminal being pulled to a negative erase voltage. This negative erase voltage, which may be generated by a negative charge pump, is coupled to the control gates of the array's selected memory cells via the word line to cause the erasing of such memory cells via, for instance, electron tunneling. If the word line associated with the output terminal has not been selected during erasing, the cross-coupled latch enters a second state which results in the output terminal being maintained at a floating potential. This floating potential is coupled to the control gates of the un-selected memory cells within the associated memory array and thereby precludes the erasing of such un-selected memory cells. The nodes of the cross-coupled latch achieve a full rail-to-rail voltage swing from the negative erase voltage to a supply voltage $V_{cc}$. Accordingly, the cross-coupled latch is less susceptible to erroneous logic states than are conventional translators such as the type described earlier with reference to FIG. 1, thereby allowing the translator to operate using small voltage supplies without providing incorrect erasing voltages to an associated memory array.

DETAILED DESCRIPTION

Figure 2:
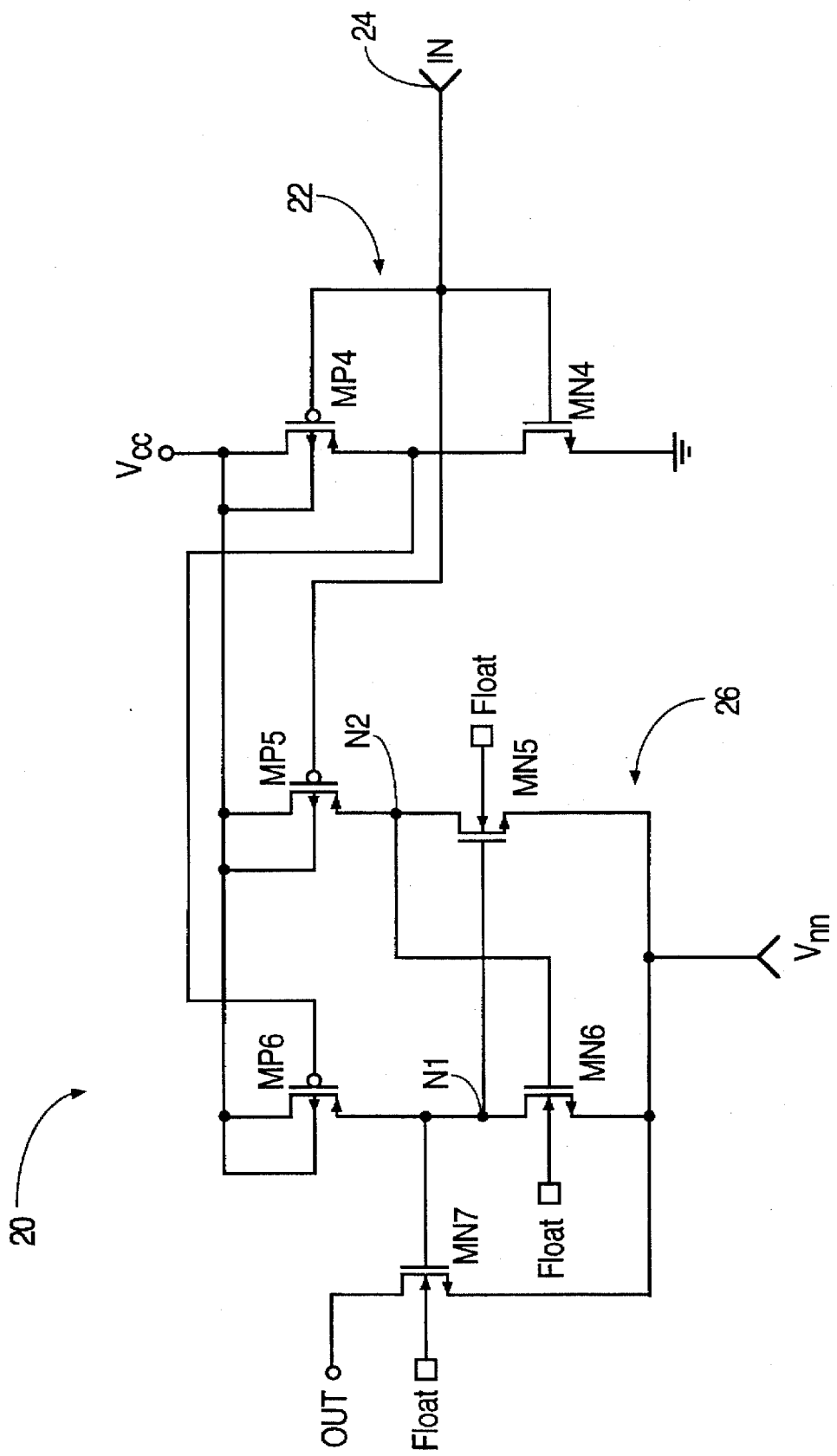
FIG. 2 is a schematic diagram of a negative voltage level translator in accordance with the present invention.

Referring to FIG. 2, circuit 20 includes a CMOS inverter 22 formed by PMOS transistor MP4 and NMOS transistor MN4 and connected between positive supply voltage $V_{cc}$ and ground potential. Translator 20 also includes a cross-coupled latch 26 formed by PMOS transistors MP5 and MP6 and NMOS transistors MN5 and MN6. Cross-coupled latch 26 includes complementary first and second nodes N1 and N2, respectively. An input control signal IN is coupled to inverter 22 via an input node 24 and is also provided to the gate of PMOS transistor MP5. The output terminal of inverter 22 is connected to the gate of PMOS transistor MP6, thereby providing the complement of input control signal IN to the gate of transistor MP6. The sources and substrates of transistors MP4, MP5, and MP6 are electrically coupled to the voltage supply $V_{cc}$. The drain of PMOS transistor MP5 is connected to the drain of an NMOS transistor MN5 and to the gate of an NMOS transistor MN6. An NMOS output transistor MN7 is connected between an output terminal OUT of circuit 20 and a negative voltage line $V_{nn}$. The gates of transistors MN5 and MN7 and the drains of transistors MP6 and MN6 are commonly coupled to a node N1. The sources of transistors MN5 and MN6 are connected to negative voltage line $V_{nn}$. Note that in other embodiments cross-coupled latch 26 may be replaced by any suitable device which controls the conductive state of transistor MN7 in the manner described below.

A negative charge pump generates a negative high voltage on negative voltage line $V_{nn}$. In some embodiments, circuit 20 employs a negative charge pump such as that disclosed in commonly owned and co-pending U.S. patent application Ser. No. 08/652,866 entitled "CHARGE PUMP" filed on May 23, 1996 and bearing Attorney Docket No. M-3781-1P US, incorporated by reference herein. The P-wells within which transistors MN5, MN6, and MN7 are formed are each electrically connected to a floating potential, as indicated in FIG. 2. Output terminal OUT may be coupled to one or more word lines of an associated memory array (not shown). In the description that follows, the operation of translator 20 is discussed in the context of providing negative erase voltages, via output terminal OUT, to the word lines of an associated memory array which employs as memory elements PMOS floating gate transistors. A PMOS floating gate transistor suitable for use in such an array is disclosed in commonly owned and co-pending U.S. patent application Ser. No. 08/557,589 entitled "PMOS MEMORY CELL WITH HOT ELECTRON INJECTION PROGRAMMING AND TUNNELLING ERASING" filed Nov. 14, 1995, and bearing Attorney Docket No. M-3546 US, incorporated herein by reference. A PMOS memory cell of the type disclosed in U.S. patent application Ser. No. 08/557,589 may be erased via Fowler-Nordheim electron tunneling from the floating gate of the cell to one or more portions of the N-well in which the cell is formed by the application of a negative high voltage to the control gate of the cell while the source, drain, and well regions of the cell are maintained at ground potential. Maintaining the control gate of such cells at a floating potential, with the source, drain, and well regions at ground potential, will preclude such electron tunneling.

It is to be understood, however, that embodiments in accordance with the present invention may be used to provide negative erase voltages to arrays employing devices other than the PMOS floating gate memory cells mentioned above such as, for instance, PMOS single-poly memory cells as disclosed in commonly owned and co-pending U.S. patent application Ser. No. 08/744,699 entitled "PMOS SINGLE-POLY NON-VOLATILE MEMORY STRUCTURE" filed Oct. 31, 1996, and bearing Attorney Docket No. M-4268 US, incorporated herein by reference, NMOS memory cells (e.g., flash, EPROM, EEPROM, and single poly), fuses, anti-fuses, and programmable logic devices.

During erasing operations, the negative charge pump (not shown) connected to negative voltage line $V_{nn}$ is active so as to generate a negative high potential such as, for instance, −11 volts on line $V_{nn}$. When the word line to which output terminal OUT is connected has not been selected via appropriate decode circuitry within the associated memory array, input control signal IN is maintained in a logic low state and thereby turns off transistor MN4 and turns on transistors MP4 and MP5. In some embodiments, the decode circuitry within the associated memory array provides in a conventional manner input control signal IN to translator 20. Once conducting, transistor MP4 pulls the gate of transistor MP6 high towards $V_{cc}$. Since in this state the source and gate of transistor MP6 are both coupled to $V_{cc}$, transistor MP6 turns completely off and thereby isolates $V_{cc}$ from node N1. Transistor MP5, once turned on, pulls node N2, and thus the gate of transistor MN6, high to $V_{cc}$. In response thereto, transistor MN6 turns on and pulls node N1 to the negative high voltage on line $V_{nn}$. In this manner latch 26 is in a first logic state where node N1 is low ($V_{nn}$) and node N2 is high ($V_{cc}$).

By pulling the gates of transistors MN5 and MN7 to the negative high voltage, e.g. −11 volts, transistors MN5 and MN7 necessarily remain in a non-conductive state. Accordingly, output terminal OUT, and thus the word line of the associated memory array to which output terminal OUT is connected, will be at a floating potential when input signal IN is in a logic low state. In this mode, the control gates of memory cells associated with output terminal OUT are at a floating potential, thereby precluding the memory cells from being erased. In other words, during erasing operations, output terminal OUT of translator 20 maintains the un-selected word line (to which translator 20 is connected) of the associated memory array at a floating potential and thereby precludes the tunneling of electrons from the floating gate to the well regions of those un-selected PMOS memory cells controlled by the word line.

Figure 1:
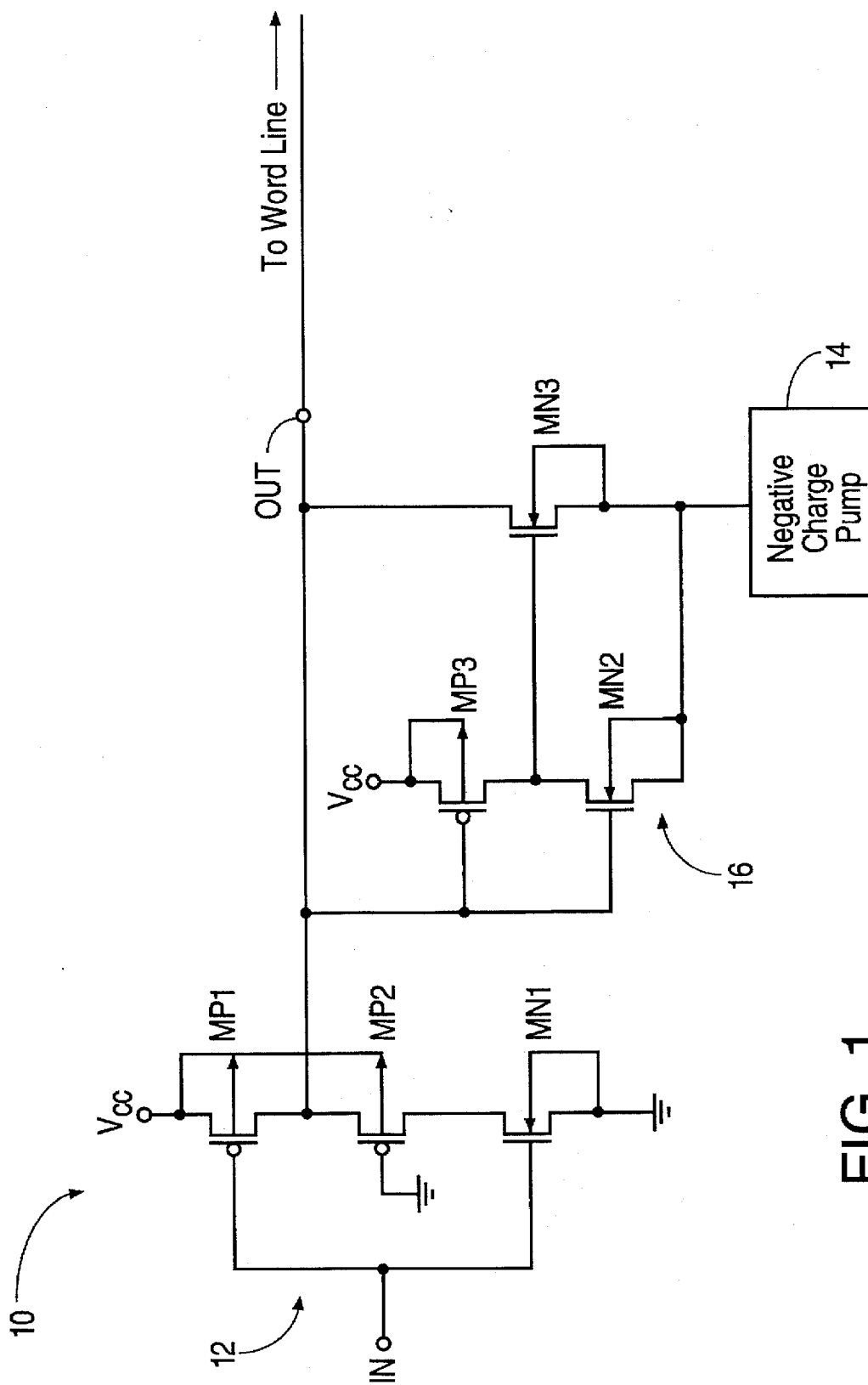
FIG. 1 is a schematic diagram of a conventional negative voltage level translator which may be used, for instance, to provide erase voltages to non-volatile memory cells.

When the word line of the associated memory array to which output terminal OUT is connected has been selected for erasing, input control signal IN transitions to a logic high level and thereby turns on transistor MN4 and turns off transistors MP4 and MP5. Once conducting, transistor MN4 pulls the gate of transistor MP6 low to ground potential and thus causes transistor MP6 to turn on. Once conducting, transistor MP6 pulls node N1 high to $V_{cc}$ which, in turn, turns on transistors MN5 and MN7. Transistor MN5 pulls node N2 low to the negative high voltage on line $V_{nn}$, thereby ensuring that transistor MN6 remains in a non-conductive state. Transistor MN7 turns on and pulls output terminal OUT low to the negative high voltage on line $V_{nn}$. In this manner, translator 20 provides a negative high voltage such as, for instance, −11 volts, to the word line (to which translator 20 is connected) of the associated memory array via output terminal OUT to facilitate the erasing of cells within the memory array. The application of such a negative voltage to the control gates of the PMOS floating gate memory cells disclosed in the above-referenced application Ser. No. 08/557,589 results in the tunneling of electrons from the respective floating gates of the PMOS memory cells to portions of the respective N-wells within which the PMOS memory cells are formed. Nodes N1 and N2 of latch 26 advantageously achieve a full rail-to-rail voltage swing from $V_{nn}$ to $V_{cc}$. Accordingly, in contrast to latch 16 of conventional translator 10 (FIG. 1), latch 26 of translator 20 is not susceptible to erroneous logic states, thereby allowing translator 20 to operate using small voltage supplies, e.g., less than 3.0 volts, without providing incorrect erasing voltages to an associated memory array.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For instance, the polarities of the above described transistors may be reversed while still realizing the advantages of the present invention.

We claim:

1. A negative voltage level translator for providing an erase voltage to a word line of an associated memory array, comprising:

an input terminal for receiving a control signal having first and second logic states;

an output terminal coupled to said word line of said memory array;

an output transistor connected between said output terminal and a negative supply providing a negative voltage; and a latch having a first node coupled to receive said control signal and having a second node coupled to receive a complement of said control signal, said second node also coupled to a gate of said output transistor, wherein said output transistor selectively pulls said output terminal to said negative voltage to facilitate erasing of one or more memory cells associated with said word line in response to said control signal being in said first logic state or allows said output terminal to assume a floating potential to preclude erasing of said one or more memory cells in response to said control signal being in said second logic state.

2. The translator of claim 1, wherein said latch comprises a cross-coupled latch.

3. The translator of claim 2, wherein said latch further comprises:

a first transistor having a first current handling terminal connected to said negative supply, a second current handling terminal connected to said first node, and a gate connected to said second node;

a second transistor having a first current handling terminal connected to said negative supply, a second current handling terminal connected to said second node, and a gate connected to said first node;

a third transistor having a first current handling terminal connected to a reference voltage supply, a second current handling terminal connected to said second node, and a gate coupled to receive said complement of said control signal; and a fourth transistor having a first current handling terminal connected to said reference voltage supply, a second current handling terminal connected to said first node, and a gate coupled to receive said control signal.

4. The translator of claim 3, wherein the bulks of said first and second transistors are maintained at said floating potential.

5. The translator of claim 3, further comprising a CMOS inverter having an input terminal coupled to receive said control signal and having an output terminal for providing said complement of said control signal.

* * * * *